United States Patent
Heikkinen et al.

(10) Patent No.: US 9,801,286 B2
(45) Date of Patent: Oct. 24, 2017

(54) MULTILAYER STRUCTURE AND RELATED METHOD OF MANUFACTURE FOR ELECTRONICS

(71) Applicant: TactoTek Oy, Kempele (FI)

(72) Inventors: Mikko Heikkinen, Oulu (FI); Pasi Raappana, Kempele (FI); Jarmo Saaski, Kempele (FI)

(73) Assignee: TactoTek Oy, Kempele (FI)

( * ) Notice: Subject to any disclaimer, the term of this patent is extended or adjusted under 35 U.S.C. 154(b) by 0 days.

(21) Appl. No.: 15/279,131

(22) Filed: Sep. 28, 2016

(65) Prior Publication Data

US 2017/0094776 A1    Mar. 30, 2017

Related U.S. Application Data

(60) Provisional application No. 62/233,730, filed on Sep. 28, 2015.

(51) Int. Cl.
*H05K 1/02* (2006.01)
*H05K 3/40* (2006.01)
*H05K 1/18* (2006.01)

(52) U.S. Cl.
CPC ........... *H05K 3/4015* (2013.01); *H05K 1/189* (2013.01); *H05K 3/4046* (2013.01); *H05K 2201/10287* (2013.01); *H05K 2203/1327* (2013.01)

(58) Field of Classification Search
CPC .............................. H05K 1/028; H05K 1/0298
See application file for complete search history.

(56) References Cited

U.S. PATENT DOCUMENTS

2008/0188099 A1    8/2008    Takahaski
2010/0202199 A1    8/2010    Nagami et al.

FOREIGN PATENT DOCUMENTS

| JP | S6242596 A | 2/1987 |
| WO | 2005056274 A2 | 6/2005 |
| WO | 2009018172 A2 | 2/2009 |

OTHER PUBLICATIONS

International Search Report dated Feb. 21, 2017, in corresponding PCT application.

(Continued)

*Primary Examiner* — Jeremy C Norris
(74) *Attorney, Agent, or Firm* — Robert P. Michal, Esq.; Carter, DeLuca, Farrell & Schmidt, LLP

(57) ABSTRACT

A multilayer structure, includes a flexible substrate film having a first side and opposite second side, a number of conductive traces, optionally defining contact pads and/or conductors, preferably printed on the first side for establishing a desired predetermined circuit design, plastic layer molded onto the first side so as to enclose the circuit between the plastic layer and the first side, and a preferably flexible connector for providing external electrical connection to the embedded circuit on the first side from the second, opposite side, one end of the connector being attached to a predetermined contact area on the first side, the other end being located on the second side for coupling with an external element, the intermediate portion connecting the two ends being fed through an opening in the substrate, wherein the opening extending through the thickness of the film is dimensioned to accommodate the connector without substantial additional clearance.

13 Claims, 2 Drawing Sheets

(56) References Cited

OTHER PUBLICATIONS

Linz, T. et al., "Embroidering Electrical Interconnects with Conductive Yarn for the Integration of Flexible Electronic Modules into Fabric", Proceedings of the Ninth IEEE International Symposium on Wearable Computers, 2005. IEEE, 2005. pp. 1-4. Berlin, Germany.
Harrison Instruments—102 Minimum Theremin Assembly Instructions. [online]. May 3, 2015 [retrieved on Feb. 2, 2017]. Retrieved from <http://web.archive.org/web/20150503182823/http://harrisoninstrumentscom/102/102_assembly_instructions.html> p. 6.

MULTILAYER STRUCTURE AND RELATED METHOD OF MANUFACTURE FOR ELECTRONICS

FIELD OF THE INVENTION

Generally the present invention relates to electronics, associated devices, structures and methods of manufacture. In particular, however not exclusively, the present invention concerns provision of external electrical connection to the internals of a structure containing a film layer and adjacent molded plastics layer integrated together.

BACKGROUND

Generally there exists a variety of different stacked assemblies and structures in the context of electronics and electronic products.

The motivation behind the integration of electronics and related products may be as diverse as the related use contexts. Relatively often size savings, weight savings, cost savings, or just efficient integration of components is sought for when the resulting solution ultimately exhibits a multi-layer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through substantially additive printing process. The used substrates may be flexible and printed materials organic, which is however, not necessarily always the case.

When a multilayer structure is loaded with various electronics, related power, data and/or control connections may have to be provided thereto, which typically requires provision of electrical connectors and related wiring even though also wireless connections may be occasionally applicable.

Commonly, the wired electrical connections between the environment and the embedded electronics of a stacked multilayer structure are provided at a side edge of the structure so that the necessary external wiring is brought into contact with a connector or other contact element that is located, and potentially protrudes out from the structure, at the periphery thereof.

However, in many use scenarios such configuration of connectors and external wiring is sub-optimum, because it puts additional constraints on the dimensioning and positioning of related host structures and components, not forgetting the features and manufacturing of the multilayer structure itself.

SUMMARY

The objective of the present invention is to at least alleviate one or more of the above drawbacks associated with the existing solutions in the context of integral multilayer structures and electronics embedded therein.

The objective is achieved with various embodiments of a multilayer structure and related method of manufacture in accordance with the present invention.

According to one embodiment of the present invention, a multilayer structure for an electronic device comprises
a preferably flexible substrate film capable of accommodating electronics, such as conductive traces and optionally electronic components such as SMDs (surface-mount device), on a first side thereof, said film having a first side and a second side,
a number of conductive traces, such as contact pads and/or conductors, preferably printed on the first side of the substrate film by printed electronics technology for establishing a desired predetermined circuit design,
plastic layer molded onto the first side of the substrate so as to enclose the circuit between the plastic layer and the first side of the substrate film, and
a preferably flexible connector for providing external electrical connection to the embedded circuit on the first side from the second, opposite side of the substrate film, one end of the connector being attached to a predetermined contact area on the first side whereas the other end is located on the second side, connecting intermediate, or 'central', portion (preferably integral with the both ends) being fed through an opening in the substrate, wherein the opening extending through the thickness of the substrate film is preferably dimensioned so as to accommodate the connector without substantial additional clearance, i.e. using 'tight' fit.

The contact area may comprise material(s) and/or element(s) that are configured to attach the connector mechanically and/or connect it electrically to the circuit (e.g. printed traces/contact pads) on the substrate. For the purpose, e.g. conductive adhesive or ACF (anisotropic conductive film) bonding may be applied.

Depending on the material of the substrate and materials/elements attached thereon (such as printing material for traces and/or other elements) and/or the configuration of the opening and related material thicknesses and shapes such as required curvature (substrate vs. connector), the connector may be relatively rigid or flexible (bendable). It may be flexible/bendable substantially across the whole length of the connector potentially excluding either or both ends thereof. In the case of a generally stiffer material, the connector may still comprise a bendable or e.g. articulated portion to facilitate its attachment on the substrate and/or threading through the opening. The longitudinal axis of the opening and the contact surface of the contact area may have an angle (e.g. about 90 deg) between them, whereupon flexibility/bendability of the connector is often preferred if not absolutely necessary. Alternatively or additionally, the connector may have been provided with a substantially fixed angle or angled portion to facilitate its routing through the opening while being able to contact e.g. a planar contact area of the substrate.

The first side and thus the associated first surface of the substrate has been at least partially, having regard to the related surface area, overmolded by plastic, preferably and typically thermoplastic, material. Optionally, several overmolding-applicable materials may be utilized to establish one or more molded layers, e.g. adjacent layers lying side-to-side on the first side of the substrate and/or forming a stack of multiple superposed layers thereon.

Optionally, a further, second film is provided on the other side of the molded layer. The second film, which may act as a substrate for graphics and/or electronics, such as electronic components and/or traces, therefore faces the molded layer from a direction opposite to the primary, or first, substrate film. The second film may have been positioned, i.e. inserted, in a mold together with the first film enabling plastic material to be injected between them. Alternatively, the second film may have been laminated onto the molded layer by feasible lamination technology using e.g. adhesive, elevated temperature and/or pressure based bonding.

In some embodiments, the (thermo)plastic material used to establish the molded layer comprises optically substantially opaque, transparent or translucent material enabling e.g. visible light to pass through it with negligible loss. The sufficient transmittance at desired wavelengths may be about 85%, 90% or 95% or higher, for example. Possible further molded (thermo)plastic material may be substantially opaque or translucent. In some embodiments, the further material may be transparent.

In a further, either supplementary or alternative, embodiment one or more of the included films may at least partially be optically substantially opaque or at least translucent having regard to predefined wavelengths e.g. in visible spectrum. The film may have been initially provided with visually distinguishable, decorative/aesthetic and/or informative, features such as graphical pattern and/or color thereon or therein. The features may have been provided on the same side of the film with the electronics so that they have been also sealed by the plastic material(s) through the associated overmolding procedure. Accordingly, IML (in-mold labeling)/IMD (in-mold decoration) technique is applicable. The film(s) may be at least partially, i.e. at least in places, optically transparent or translucent to radiation such as visible light emitted by the electronics thereon. The transmittance may be about 85%, 90%, 95% or higher, for example.

According to one other embodiment, a method for manufacturing a multilayer structure for an electronic device, comprises
obtaining a substrate film for accommodating electronics, preferably printing a number of conductive traces, and optionally electronic components, on a first side of the substrate film to establish a predetermined circuit design, establishing an opening, such as a slit or a hole, in, and through, the thickness of the substrate film, optionally substantially adjacent to a predefined contact area, wherein the opening is preferably dimensioned so as to match the dimensions of a preferably flexible connector in a predetermined feed-through position without substantial additional clearance,
directing at least part of the connector, such as one end of a connector cable or wire, through the established opening, wherein one end of the connector is prior to, upon or after said directing attached to a predefined contact area on the first side of the substrate film, the other end being located after said directing, at the latest, on the second side for electrically connecting to an external conductive element, and
molding thermoplastic material on said first side of the substrate film to substantially seal the circuit between the plastic layer and the first side of the substrate film.

The method may further comprise providing material(s) and/or element(s) that are configured to attach the connector mechanically and/or connect it electrically to the circuit (e.g. printed traces/contact pads), on the contact area of substrate (and/or at the connector end connecting thereto). For the purpose, e.g. conductive adhesive or especially ACF (anisotropic conductive film) material and related bonding technique may be applied.

In detail, suitable anisotropic material such as paste or film may be first provided on the contact area to electrically connect the circuit and the connector. The connector may be then pressed against the anisotropic material. Optionally, heat may be applied to enhance the attachment of the associated adhesive (e.g. through better flow).

The mutual execution order of various method items may be determined case-specifically in each embodiment. For example, the opening may be established prior to, upon or after attaching one end of the connector to the contact area of the substrate. Accordingly, the connector may be directed through the opening prior to, upon or after attaching it to the substrate depending e.g. on the desired threading direction.

The opening may be provided by drilling, carving, sawing, etching, cutting (e.g. with laser or mechanical blade) or using any other feasible method as being understood by a person skilled in the art.

The opening may have a desired shape, i.e. a substantially circular or angular hole, or a flat and/or narrow slit, may be established. It may substantially have (side) cross-section of a parallelogram, for example, or it may practically be described as a narrow slit. It may bear rounded shape(s) to enable flexible connector to bend in contact therewith without additional slack. Preferably the opening is shaped and dimensioned so as to match the shapes/dimensions of the accommodated connector portion so that additional clearance is not formed at the interface. Alternatively or additionally, supplementary sealing and/or attachment material may be provided at the interface (opening).

A number of electronic components may be provided, by printing and/or mounting, for example, on the first side of the substrate film to establish the desired circuit thereon, which may have control, measurement, UI, data processing, storage, etc. purpose.

Optionally a further, second film may be provided on the other side of the molded plastic as mentioned hereinbefore. It may be located in a mold as well together with the primary first substrate carrying the flap so that a stacked structure is obtained by injecting the plastic material in between, or the second film may be provided afterwards using a suitable lamination technique if not being directly manufactured on the molded plastic layer. The second film may have electronics on any side thereof as well as e.g. graphics (application of IMD/IML technique thus possible). Yet, it may have a protective purpose and/or other technical features such as desired optical transmittance, appearance (e.g. color) or feel.

The feasible molding methods include e.g. injection molding. In case of several plastic materials, they may be molded using a two-shot or generally multi-shot molding method. A molding machine with multiple molding units may be utilized. Alternatively, multiple machines or a single re-configurable machine could be used for sequentially providing several materials.

The previously presented considerations concerning the various embodiments of the structure may be flexibly applied to the embodiments of the method mutatis mutandis, and vice versa, as being appreciated by a skilled person.

The utility of the present invention arises from a plurality of issues depending on the embodiment.

An integral, electrical connector may be conveniently established from initially separate and simple connector element such as a flexible strip. The element may comprise or consist of conductive material such as preferred metal (silver, copper, gold, etc.) or conductive polymer. Complex and space-consuming connectors with own dedicated housing or e.g. a rigid circuit board may be omitted. The location of the connector may be flexibly determined and there's no need to position the connectors at the lateral edges of a multilayer structure anymore, which greatly adds to the structural and potentially also functional versatility of the structure and host devices or products they may be disposed at. The connector is preferably bendable/flexible and requires only little space, which facilitates connecting external elements such as connectors or wiring therewith as their initial location is not that critical anymore. The suggested manufacturing method applying overmolding is relatively straightforward and what is considered really beneficial, does not necessitate adopting completely new or different manufacturing technologies just for producing the sufficient connectivity in the context of printed and in-mold electronics.

Similar connector structure may also find use in other scenarios wherein the electrical connection is potentially unnecessary, but e.g. optical connection is desired. Instead or in addition to conductive material, electrical wiring or e.g. printed traces, the connector may comprise e.g. optical fiber.

Generally, the obtained multilayer structure may be used to establish a desired device or module in a host element such as an intelligent garment (e.g. shirt, jacket, or trousers, or e.g. a compression garment), other piece of wearable electronics (e.g. wristop device, headwear, or footwear), vehicle, personal communications device (e.g. smartphone, phablet or tablet) or other electronics. The integration level of the obtained structure may be high and desired dimensions such as the thickness thereof small.

The used film(s) may contain graphics and other visually and/or tactilely detectable features thereon, whereupon the film may have aesthetic and/or informative effect in addition to hosting and protecting the electronics. The film(s) may be translucent or opaque at least in places. They may be of desired color or comprise portions of desired color. The obtained multilayer structure may thus incorporate one or more color/colored layers that optionally determine graphics such as text, pictures, symbols, patterns, etc. These layers may be implemented by dedicated films of certain color(s), for instance, or provided as coatings (e.g. through printing) on existing film(s), molded layer(s), and/or other surfaces.

The film(s) may be configured to establish at least a portion of outer and/or inner surface of the associated product.

The visual features such as patterns or coloring may be provided via internal layers, e.g. on the side of the first and/or second film that is facing the molded plastics so that the features remain isolated and thus protected from the environmental effects at least by the thickness of the film. Accordingly, different impacts, rubbing, chemicals, etc. that could easily damage e.g. painted surface features do not normally reach them. The film may be easily manufactured or processed, optionally cut, into a desired shape with necessary characteristics such as holes or notches for exposing the underlying features such as the molded material.

The molded thermoplastic material(s) may be optimized for various purposes including securing electronics in view of the molding process. Yet, the material may be configured to protect the electronics from e.g. environmental conditions such as moisture, heat, cold, dirt, shocks, etc. It may further have desired properties in view of light transmittance and/or elasticity, for example. In case the embedded electronics includes light- or other radiation-emitting or receiving components, the material may have sufficient transmittance to enable light transmission therethrough.

The expression "a number of" may herein refer to any positive integer starting from one (1).

The expression "a plurality of" may refer to any positive integer starting from two (2), respectively.

The terms "first" and "second" are herein used to distinguish one element from other element, and not to specially prioritize or order them, if not otherwise explicitly stated.

The terms "film" and "foil" are herein used generally interchangeably, unless otherwise explicitly indicated.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

Figure 1:
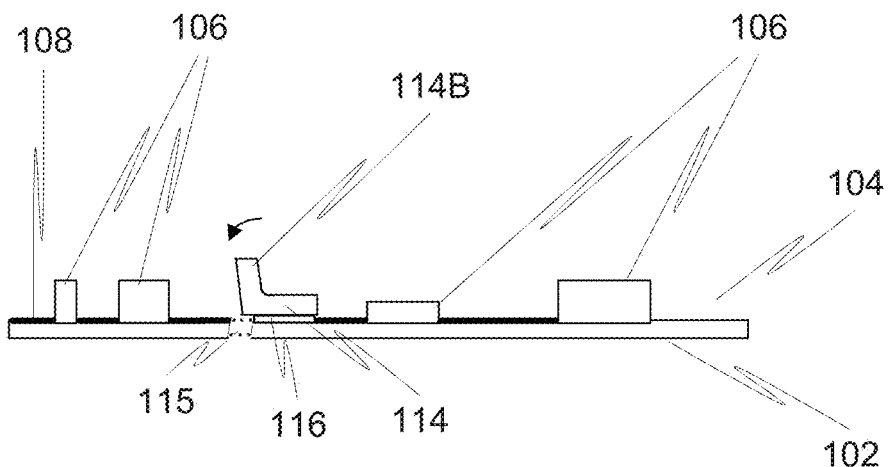
FIG. 1 illustrates one embodiment of a multilayer structure in accordance with the present invention prior to molding.

FIG. 1 illustrates, via a cross-sectional side view, an embodiment 100 of a multilayer structure prior to molding. The finished multilayer structure may establish an end product of its own, e.g. electronic device or element (e.g. cable, connector device), or be disposed in a host device as an aggregate part or module.

The structure 100 comprises a (first) substrate film 102 such as flexible plastic film to accommodate electronics, such as electrically conductive traces (defining e.g. conductor lines, contact pads, etc.) 108 and optionally components 106, printed on a first side and respective surface thereof by means of printed electronics technology, such as screen printing, flexography or ink jetting. The printed elements incorporating at least the traces 108 are configured so as to establish a desired circuit design.

In addition to or instead of printed versions, the components may include ready-made components (surface-) mounted on the substrate 102, such as so-called surface-mounted elements. For example, adhesive may be utilized for mechanically securing the electronics 508 on the substrate. Conductive materials such as conductive adhesive and/or solder may be applied for establishing electrical and also mechanical connections.

Figure 2:
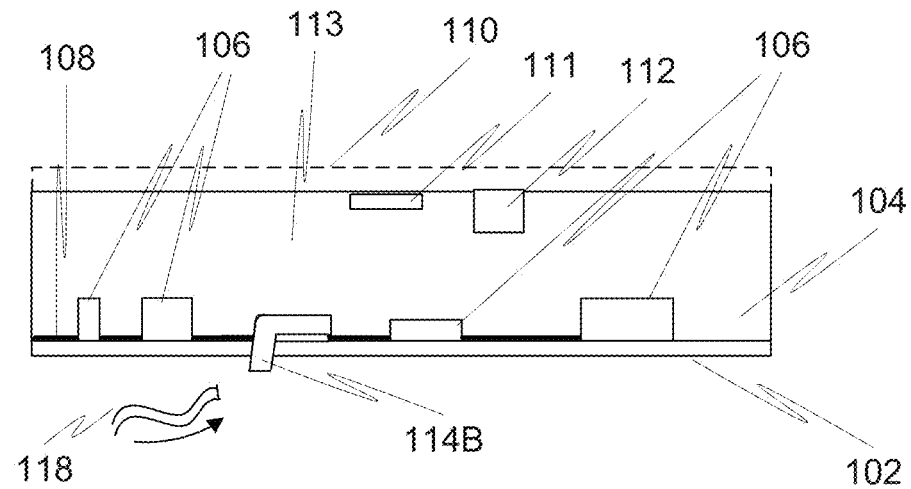
FIG. 2 illustrates the embodiment of FIG. 1 after molding.

The substrate 102 and electronics 106, 108 are to be at least partially covered by at least one molded plastic layer 104 as shown in FIG. 2.

An optional second film 110 of same or different material with the first film 102 may be present in the multilayer stack as well. The film 110 may accommodate electronics 112, graphics 111 and/or other features considered advantageous. Further film, coating, etc. may be optionally provided on the second film 110 e.g. for aesthetic, protective/insulating or other purposes.

An electrically conductive connector element 114 is provided on the substrate 102 prior to molding. The connector 114 may include e.g. PC (polycarbonate), polyimide, etc. An opening, such as a flat slit or e.g. circular hole, 115 is arranged to provide a feed-through to the connector 114. The connector 114 may comprise e.g. a circular wire or cable, whereupon the opening 115 may generally have a circular cross-section established using e.g. a drill. Alternatively, the connector 114 may comprise a flat cable, a round cable that can be compressed into substantially flat or at least flatter shape (without damage) or a similar element having considerably uneven dimensions in lateral and transverse directions. In these cases, the flat connector 114 may be accommodated by a matching flat slit type opening 115 in the substrate 102. The opening 115 may be positioned in the center region or, when desired, periphery region of the substrate 102 depending on and often substantially neighbouring the location of the contact area on the first side of the substrate 102 and/or the location of connecting external element on the second side.

One end of the initially separate connector 114 is attached to the substrate 102 both physically and electrically. The other end 114B, or 'tail', provides the external connectivity. Thus at least part of the connector 114 is fed through the opening 115 prior to molding. It can be either end depending on the embodiment and the order of various related method phases. If the connector is connected first to the contact area 116 on the first side of the substrate 102, which may take place even prior to establishing the opening 115, the tail 114B is then threaded through the opening 115 that may optionally receive further sealing material prior to, upon or after threading. This is followed by overmolding phase during which the plastic layer 104 is produced. Alternatively, the opening 115 may be first adapted to accommodate the middle portion of the connector 114, which is threaded to a suitable position, after which the substrate end of the connector 114 is secured to the contact area 116 prior to overmolding. In the depicted scenario in FIG. 1, the connector 114 was first attached to the contact area 116 on the first side of the substrate 102 and thereafter threaded through the opening 115 so that the tail 114B ends up on the second side.

The tail 114B may be then connected to an external element 118, such as power, data, or control wiring, or a related connector, on the second side of the substrate 102.

The contact area 116 may include (printed) traces, contact pads and/or material or element such as anisotropic material that physically adheres to the substrate 102 and connector 114 and conducts electricity in desired manner, typically in desired direction(s). In some embodiments, dedicated physical/mechanical fastening elements may be used in addition to the electrical ones.

Figure 3:
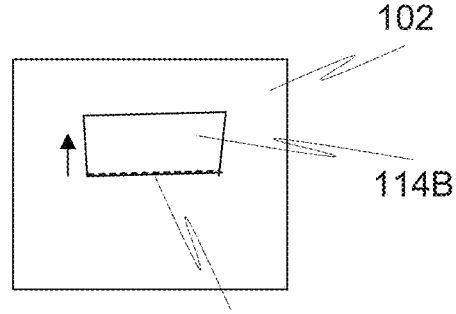
FIG. 3 depicts a bottom view of the embodiment of the multilayer structure of FIGS. 1 and 2 with the connector flap shown from another perspective.

FIG. 3 depicts the substrate 102 when inspected from a direction opposite to the molded layer 104, i.e. via a planar 'bottom-up' view. The tail 114B contains in this example relatively flat but wide shape and the opening 115 substantially matches this design (flat but wide slit). The tail 114B is fed through the slit 115 as indicated by the arrow to establish a kind of a flap on the second side (bottom), i.e. environment side, of the substrate 102. At least the tail 114B is preferably flexible to facilitate the threading procedure and later application thereof. In alternative embodiments as discussed hereinbefore, the other end (not visible in the figure, being on the other side, i.e. first side, of the substrate 102) of the connector 114 can be fed through the opening 115 from the second to the first side so that the tail 114B remains on the second, i.e. environment, side of the substrate 102 all the time.

Having regard to the material selections, the film(s) 102, 110 may substantially consist of or comprise at least one material selected from the group consisting of: polymer, thermoplastic material, PMMA (Polymethyl methacrylate), Poly Carbonate (PC), polyimide, a copolymer of Methyl Methacrylate and Styrene (MS resin), glass, Polyethylene Terephthalate (PET), and metal.

In some embodiments, the film(s) 102, 110 may include or be coated or covered by further materials/material layers e.g. on the side facing the environment (i.e. not the electronics 106, 108, 112 and molded material 104). E.g. textile or biological or bio-based materials (e.g. leather, wood, paper, cardboard) in addition to or instead of more conventional layers may be provided. Also e.g. rubber or generally rubberous material may be used. Such layers may have different functionalities, such as a protective function, characterizing desired feel, aesthetic or particular desired light transmissive and/or reflective function and/or indicative function.

The plastic layer(s) 104, provided by the overmolding procedure, may generally incorporate e.g. elastomeric resin. In more detail, the layer(s) 104 may include one or more thermoplastic materials that include at least one material selected from the group consisting of: PC, PMMA, ABS, PET, nylon (PA, polyamide), polypropylene (PP), polystyrene (GPPS), and MS resin.

The electronics 106, 112 may include one or more components, such as passive components, active components, ICs (integrated circuit), and/or sub-assemblies. The components may be printed and/or mounted among other feasible options.

For instance, one or more components may be first provided on a separate substrate, e.g. a circuit board such as an FPC (flexible printed circuit) or e.g. rigid, e.g. FR4 type (flame retardant), board, and subsequently attached as a whole (i.e. as a sub-assembly) to the target substrate 102, 110.

In the case of a flexible, e.g. FPC type, circuit board or similar sub-assembly one end or extension thereof may establish at least part of an (electrical) connector, such as the connector 114.

A further connector of preferably flexible type may be provided to the rigid or flexible circuit board or other sub-assembly for electrically connecting it to the substrate 102, 110.

At least a portion of a circuit board or other sub-assembly may be optionally located between the substrate 102 and the connector 114 at the contact area 116. The connector 114 may thus contact and e.g. electrically connect to the circuit board or other sub-assembly directly.

In more detail, the electronics 106, 112 may include at least one element selected from the group consisting of: optoelectronic component, microcontroller, microprocessor, signal processor, DSP (digital signal processor), sensor, programmable logic chip, memory, transistor, resistor, capacitor, inductor, memory array, memory chip, data interface, transceiver, wireless transceiver, transmitter, receiver, wireless transmitter, and wireless receiver.

Still, the electronic components carried by the structure may include at least one optoelectronic component. The at least one optoelectronic component may include a LED (light-emitting diode), an OLED (organic LED), or some other light-emitting component, for example. The components may be side-emitting ('side shooting'). Alternatively or additionally, it may include light-receiving or light-sensitive component such as a photodiode, photoresistor, other photodetector, or e.g. a photovoltaic cell. The optoelectronic component such as OLED may have been printed on the substrate film using a preferred method of printed electronics technology.

Indeed, e.g. different sensing and/or other functionalities may be implemented by the embedded ICs, dedicated components, or shared ICs/electronics (multi-purpose electronics).

The film(s) 102, 110 may be shaped according to the requirements set by each use scenario. They 102, 110 may exhibit e.g. a rectangular, circular, or square general shape. They 102, 110 may further contain recesses, notches, cuts or openings for various purposes such as attachment to other elements, fitting electronics or other components, provision of passages for light or other radiation, fluid, etc.

Figure 4:
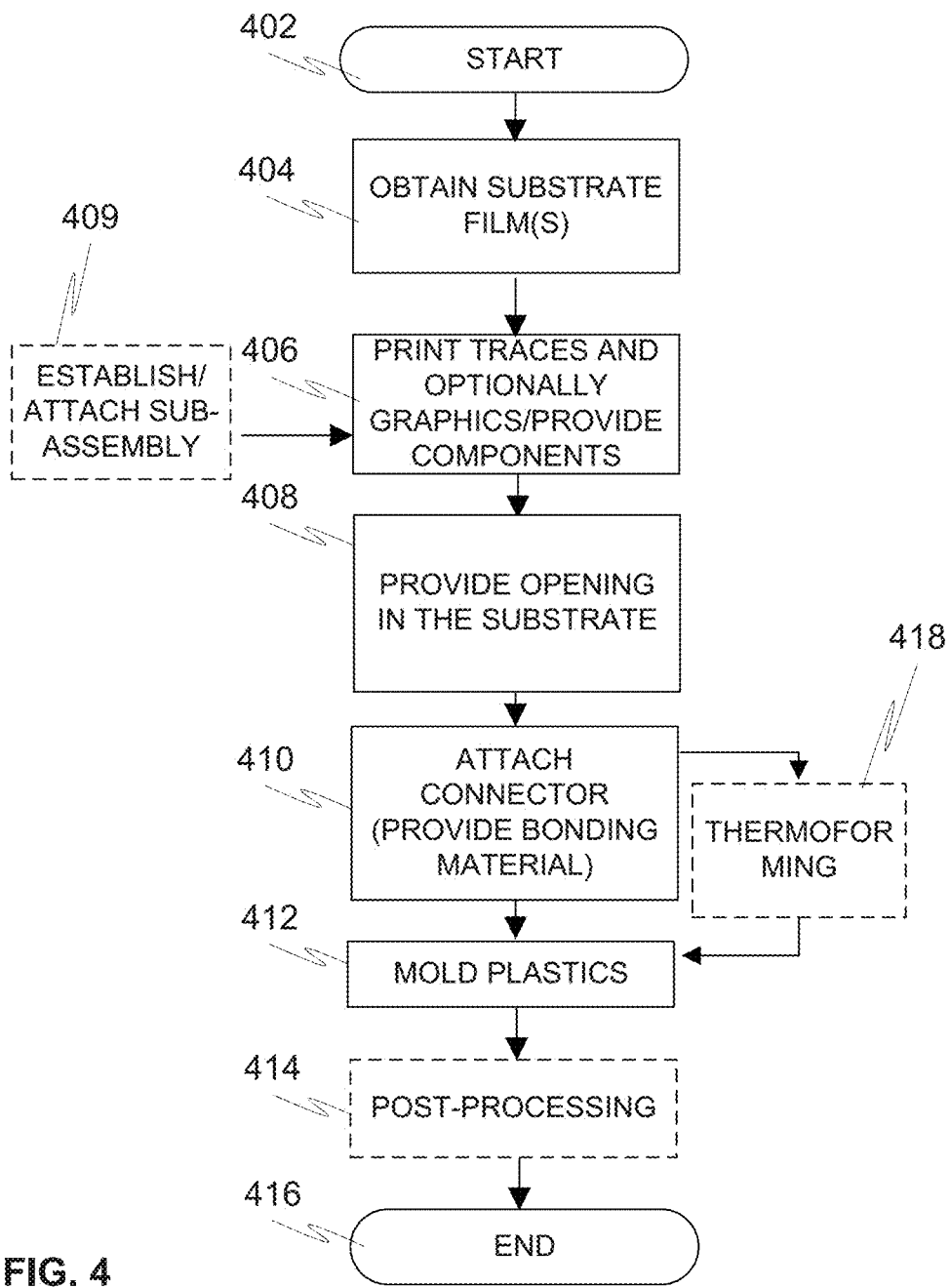
FIG. 4 is a flow diagram disclosing an embodiment of a method in accordance with the present invention.

FIG. 4 includes a flow diagram 400 disclosing an embodiment of a method in accordance with the present invention.

At the beginning of the method for manufacturing the multilayer structure, a start-up phase 402 may be executed. During start-up 402, the necessary tasks such as material, component and tools selection, acquisition, calibration and other configuration may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, thermoforming, cutting, drilling and/or printing equipment, among others, may be thus ramped up to operational status at this stage.

At 404, at least one, preferably flexible, substrate film or other preferably planar substrate for accommodating electronics is obtained. A ready-made element of substrate material, e.g. roll of plastic film, may be acquired. In some embodiments the substrate film itself may be first produced in-house by molding or other methods from the desired starting material(s). Optionally, the substrate film is processed. It may be, for example, provided with openings, notches, recesses, cuts, etc. as contemplated hereinbefore.

At 406, a number of conductive traces defining e.g. conductor lines, contact pads (or other contact areas), etc. for electrically coupling electronic components, are provided on the film(s), preferably by one or more techniques of printed electronics. For example, screen, inkjet, flexographic, gravure or offset lithographic printing may be utilized. Also further actions cultivating the film(s) involving e.g. printing of graphics, visual indicators, etc. on the film(s) may take place here.

Further electronics and/or material non-adherent to molded plastics may be arranged on the substrate, optionally by printing.

Ready-made components such as various SMDs may be attached to the contact areas by solder and/or adhesives. Alternatively or additionally, printed electronics technology may be applied to actually manufacture at least part of the components, such as OLEDs, directly onto the film(s).

At 408, the substrate is provided with an opening to as act as feed-through of a connector. The opening may be produced by removing material from the substrate using e.g. a drill, by cutting or shaping the material to provide e.g. a slit therein, or by manufacturing the substrate (therefore process-wise combining item 408 with 404) in a manner that it inherently contains the opening (e.g. produced by suitable mold shapes such as a column or pillar) defined by the surrounding walls of the substrate material. Preferably the opening is dimensioned and shaped so as to accommodate the target portion of the connector (which will remain at the opening upon and after molding) without additional slack so that the molded material is prevented from entering the second side of the substrate (if not particularly desired for some reason). To further seal the interface between the opening and the connector, specific sealing material or element may be optionally utilized. Alternatively, item 408 could be executed in connection with item 410 upon or after attaching the connector/providing bonding material but obviously still prior to leading one end of the connector through the substrate via the established opening.

Item 409 refers to possible attachment of one or more sub-systems or 'sub-assemblies' that may incorporate an initially separate, secondary substrate provided with electronics such as IC(s) and/or various components. At least part or all of the electronics of the multilayer structure may be provided to the substrate film(s) via such sub-assembly. Optionally, the sub-assembly may be at least partially overmolded by a protective plastic layer prior to attachment to the main substrate. For example, adhesive, pressure and/or heat may be used for mechanical bonding of the sub-assembly with the primary (host) substrate. Solder, wiring and conductive ink are examples of applicable options for providing the electrical connections between the elements of the sub-assembly and with the remaining electrical elements on the primary substrate. Item 409 could also be executed e.g. upon item 408. The shown position thereof is primarily exemplary only.

In some embodiments, prior to or upon the molding phase the substrate film(s) optionally already containing electronics may be thermoformed 418. The substrate containing thermoformable material may be shaped to better fit the target environment/device or target use. Additionally or alternatively, thermoforming could take place after molding in case the already-established multilayer stack is designed to survive such processing.

At 410, the connector is attached to the contact area on the first side of the substrate and partially fed through the opening to the other, second side. The mutual execution order of these two actions may vary depending on the embodiment as explained hereinbefore.

In some embodiments, specific bonding material for securing physical/mechanical and/or electrical contact with the substrate may be additionally provided e.g. in the form of anisotropic film (containing conductive adhesive/paste) on the substrate for coupling the connector.

At 412, after positioning the connector so that its tail remains on the second side of the substrate film for enabling external electrical connectivity, thermoplastic layer is molded upon the first side of the substrate film and electronics thereon, such as traces and a number of electronic components. In practice, the substrate film may be used as an insert in an injection molding process. The first side and associated surface of the substrate element may be, in some embodiments, left with one or more areas free from the molded plastics.

In case, two films are used, both of them may be inserted in their own mold halves so that the plastic layer is injected between them. Alternatively, the second film could be attached to an aggregate of first film and plastic layer afterwards by suitable lamination technique.

Regarding the resulting overall thickness of the obtained stacked structure, it heavily depends on the used materials and related minimum material thicknesses providing the necessary strength in view of the manufacturing and subsequent use. These aspects have to be considered on case-by-case basis. For example, the overall thickness of the structure could be about 1 mm, but considerably thicker or thinner embodiments are also feasible.

Item 414 refers to possible post-processing tasks. Further layers may be added into the multilayer structure by lamination or suitable coating (e.g. deposition) procedure. The layers may be of indicative or aesthetic value (graphics, colors, figures, text, numeric data, etc.) and contain e.g. textile, leather or rubber materials instead of or in addition to further plastics. Additional elements such as electronics may be installed at the outer surface(s) of the structure, such as the exterior surface of the substrate. Shaping/cutting may take place. The embedded connector may be connected to a desired external element such as cable, wiring or other connector.

At 416, method execution is ended.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario. For instance, instead of or in addition to molding the plastics directly onto the substrate, the plastic layer could be prepared upfront and then attached to the substrate by suitable lamination technique applying e.g. adhesive, mechanical attachment means (screws, bolts, nails, etc.), pressure and/or heat. Finally, in some scenarios, instead of molding, the plastic or other layer of similar function could be produced on the substrate using a suitable deposition or further alternative method. Yet, instead of printed traces, the traces could be produced/provided otherwise. E.g. a conductor film manufactured utilizing etching, for example, could be applied.

The invention claimed is:

1. A multilayer structure (100), comprising
a preferably flexible substrate film (102) having a first side and opposite second side,
a number of conductive traces (108), optionally defining contact pads and/or conductors, preferably printed on the first side of the substrate film for establishing a desired predetermined circuit design,
plastic layer (104) molded onto the first side of the substrate film (102) so as to enclose the circuit between the plastic layer and the first side of the substrate film (102), and
a preferably flexible connector (114) for providing external electrical connection to the embedded circuit on the first side from the second, opposite side of the substrate film (102), one end of the connector being attached to a predetermined contact area (116) on the first side whereas the other end (114B) is located on the second side of the substrate for coupling with an external element (118), an intermediate portion connecting the two ends being fed through an opening (115) in the substrate film (102), wherein the opening (115) extending through the thickness of the substrate film (102) is preferably dimensioned so as to accommodate the connector (114) without substantial additional clearance.

2. The structure of claim 1, wherein the substrate film (102) contains, at the contact area (116), element or material adherent to the connector to physically secure and electrically couple the connector to the embedded circuit, said adherent material preferably containing conductive anisotropic material.

3. The structure of claim 1, comprising a sub-assembly (106) containing a circuit board, optionally FPC (flexible printed circuit), on the first side of the substrate film (102), as at least partially enclosed within the plastic layer (104).

4. The structure of claim 3, comprising, at the contact area (116), the circuit board as disposed between the substrate film (102) and the connector (114).

5. The structure of claim 3, wherein the circuit board is substantially rigid, optionally of FR4 type.

6. The structure of claim 3, wherein the circuit board is flexible and an end or extension thereof establishes at least portion of the connector (114).

7. The structure of claim 1, comprising a further film (110) on the side of the plastic layer (104) facing away from the substrate film (102), optionally accommodating graphics (111) and/or electronics (112) thereon.

8. The structure of claim 1, comprising one or more embedded color or graphical layers preferably exhibiting a desired color, figure, graphical pattern, symbol, text, numeric, alphanumeric and/or other visual indication.

9. A method for manufacturing a multilayer structure, comprising
obtaining a substrate film for accommodating electronics (404),
providing, preferably through printing, a number of conductive traces (108), and optionally electronic components (106), on a first side of the substrate film to establish a predetermined circuit design (406),
establishing an opening, such as a slit or a hole, in, and through, the thickness of the substrate film, optionally substantially adjacent to a predefined contact area, wherein the opening is preferably dimensioned so as to match the dimensions of a preferably flexible connector in a predetermined feed-through position without substantial additional clearance (408),
directing part of the connector, such as one end of a connector cable or wire, through the opening, wherein one end of the connector is prior to, upon or after said directing attached to a predefined contact area on the first side of the substrate film, the other end being located after said directing, at the latest, on the second side for electrically connecting to an external element (410), and
molding thermoplastic material on said first side of the substrate film to substantially seal the circuit between the plastic layer and the first side of the substrate film (412).

10. The method of claim 9, wherein a sub-assembly containing an FPC or rigid circuit board, optionally FR4, is provided on the first side of the substrate.

11. The method of claim 10, wherein the circuit board is electrically and optionally physically connected to said one end of the connector.

12. The method of claim 10, wherein the connector is substantially formed from one end or extension of the FPC.

13. The method of claim 10, wherein a preferably flexible further connector is provided to electrically connect the sub-assembly to the substrate, optionally a trace thereon.

* * * * *